(12) United States Patent
Li et al.

(10) Patent No.: US 10,008,634 B2
(45) Date of Patent: Jun. 26, 2018

(54) THIN-FILM FLIP-CHIP LIGHT EMITTING DIODE HAVING ROUGHENING SURFACE AND METHOD FOR MANUFACTURING THE SAME

(71) Applicant: GENESIS PHOTONICS INC., Tainan (TW)

(72) Inventors: Yi-Fan Li, Tainan (TW); Jing-En Huang, Tainan (TW); Sie-Jhan Wu, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days. days.

(21) Appl. No.: 15/726,673

(22) Filed: Oct. 6, 2017

(65) Prior Publication Data

US 2018/0033914 A1    Feb. 1, 2018

Related U.S. Application Data

(62) Division of application No. 15/423,595, filed on Feb. 3, 2017, now Pat. No. 9,786,813, which is a division
(Continued)

(30) Foreign Application Priority Data

Oct. 9, 2014    (TW) .............................. 103135236 A

(51) Int. Cl.
*H01L 21/00*    (2006.01)
*H01L 33/22*    (2010.01)
(Continued)

(52) U.S. Cl.
CPC .......... *H01L 33/22* (2013.01); *H01L 33/0095* (2013.01); *H01L 33/06* (2013.01);
(Continued)

(58) Field of Classification Search
CPC ... H01L 33/005; H01L 33/0095; H01L 33/22; H01L 33/06; H01L 33/486
(Continued)

(56) References Cited

U.S. PATENT DOCUMENTS

2014/0061710 A1    3/2014    Kim et al.

FOREIGN PATENT DOCUMENTS

TW    201248919 A1    12/2012

OTHER PUBLICATIONS

TIPO Office Action dated Dec. 19, 2017 in Taiwan application (No. 106116592).
(Continued)

*Primary Examiner* — David S Blum
(74) *Attorney, Agent, or Firm* — McClure, Qualey & Rodack, LLP

(57) ABSTRACT

A thin-film flip-chip light emitting diode (LED) having a roughened surface and a method for manufacturing the same are provided. First, a substrate having a patterned structure on a surface of the substrate is provided, and the surface is roughened. A first semiconductor layer is then formed on the surface; a light emitting structure layer is then formed on the first semiconductor layer; a second semiconductor layer is then formed on the light emitting structure layer. The first and second semiconductor layers possess opposite electrical characteristics. A first contact electrode and a second contact electrode are then formed on the first semiconductor layer and the second semiconductor layer, respectively. Finally, a sub-mount is formed on the first and second contact electrodes, and the substrate is removed to form the thin-film flip-chip LED having the roughened surface. Here, the light emitting efficiency of the thin-film flip-chip LED is improved.

14 Claims, 4 Drawing Sheets

Related U.S. Application Data of application No. 14/877,948, filed on Oct. 8, 2015, now Pat. No. 9,564,554.

(51) Int. Cl.
*H01L 33/00* (2010.01)
*H01L 33/06* (2010.01)

(52) U.S. Cl.
CPC .............. *H01L 2933/0016* (2013.01); *H01L 2933/0033* (2013.01); *H01L 2933/0091* (2013.01)

(58) Field of Classification Search
USPC .............................................. 438/22, 26, 40
See application file for complete search history.

(56) References Cited

OTHER PUBLICATIONS

"Semiconductor Light Emitting Diodes and Solid State Lighting (Second Edition)"; Oct. 1999; Open Tech/www.optentech.com.tw; pp. 4-60-470.

THIN-FILM FLIP-CHIP LIGHT EMITTING DIODE HAVING ROUGHENING SURFACE AND METHOD FOR MANUFACTURING THE SAME

CROSS-REFERENCE TO RELATED APPLICATION

This application is a divisional application of U.S. application Ser. No. 15/423,595, filed on Feb. 3, 2017, now issued as U.S. Pat. No. 9,786,813, which is a divisional application of U.S. application Ser. No. 14/877,948, filed on Oct. 8, 2015, now issued as U.S. Pat. No. 9,564,554. The prior application Ser. No. 14/877,948 claims the priority benefit of Taiwan application serial no. 103135236, filed on Oct. 9, 2014. The entirety of each of the above-mentioned patent applications is hereby incorporated by reference herein and made a part of this specification.

FIELD OF INVENTION

The invention relates to a thin-film flip-chip light emitting diode (LED) with a roughened surface and a method for manufacturing the thin-film flip-chip LED. In particular, the invention relates to a thin-film flip-chip LED that has a roughened surface and is formed by performing a roughening process and a method for manufacturing the thin-film flip-chip LED. Through performing an etching process, a light output surface of the thin-film flip-chip LED can be roughened, such that the light emitting efficiency of the thin-film flip-chip LED can be effectively enhanced.

DESCRIPTION OF RELATED ART

Compared with conventional incandescent light sources, light emitting diodes (LED) have the advantages of reduced power consumption, compactness, low driving voltage, the absence of mercury and thermal radiation, fast operating speed, and long service lives and are one of the power-saving light sources widely applied in next generation. In particular, the LEDs have been widely used as indicating lamps in home appliances, used as back light sources of liquid crystal displays, applied to screens displaying graphics and texts, used as third brake lights on vehicles, and employed in other illumination fields. Semiconductor light emitting devices including resonant-cavity light emitting diodes (RCLED), vertical-cavity surface-emitting diodes (VCSEL), and edge emitting laser are all available and effective light emitting devices; however, the improvement of the light emitting efficiency of the LEDs is one of the issues to be resolved immediately, and thus various methods of improving the light emitting efficiency of the LEDs have been proposed.

According to the related art, e.g., in R.O.C. patent no. 1422068, the method for manufacturing an LED having a roughened surface includes: providing an epitaxy component including a substrate, an epitaxy structure layer, and a first electrode layer, wherein the epitaxy structure layer is located on the substrate and includes a first electric type semiconductor layer, an active layer, and a second electric type semiconductor layer, the active layer is located between the first and second electric type semiconductor layers, the first electric type semiconductor layer is located between the active layer and the substrate, and the first electrode layer electrically connects with the first electric type semiconductor layer; etching a surface of the second electric type semiconductor layer with an excimer laser having an energy intensity of 1000 mJ/cm$^2$ or less to form a first roughened surface including a plurality of first protrusions; performing a wet etching process on the first roughened surface to form a plurality of second protrusions; forming a second electrode layer on the second electric type semiconductor layer. Present invention enhances the light extraction efficiency of a light output surface of the LED as well as to reduce the operating voltage. However, the LED manufactured by applying said manufacturing method may encounter the issue of process complexity. Besides, it is rather difficult to control the wet etching process performed for roughening and shaping the second protrusions; thus, the dimensions of the resultant second protrusions may not be accurately determined, and the final structure may be uneven. Moreover, according to the disclosure of the aforesaid patent, the roughening process is performed after the thin films are stacked and the components are formed and shaped; as such, the underlying structure that is already formed may be affected, and further the electrical behavior of the LED may be affected as well, leading to a reduction of the light emitting efficiency of the LED. As a result, how to manufacture an even LED structure by performing a simple manufacturing process and how to enhance the light emitting efficiency of the resultant LED are important issues to be resolved by researchers in the LED and pertinent fields.

SUMMARY

The invention is directed to a thin-film flip-chip light emitting diode (LED) with a roughened surface and a method for manufacturing the thin-film flip-chip LED. In particular, the invention relates to a thin-film flip-chip LED with a roughened surface formed by performing a roughening process and a method for manufacturing the thin-film flip-chip LED. Through performing an etching process, a light output surface of the thin-film flip-chip LED can be roughened, such that the light emitting efficiency of the thin-film flip-chip LED can be effectively enhanced.

A thin-film flip-chip LED having a roughened surface and a method for manufacturing the same are provided. In the method, at least following steps are included. A substrate is provided, and the substrate has a pattern structure on its surface. The surface having the pattern structure is roughened. A first semiconductor layer is formed on the surface having the pattern structure, a light emitting structure layer is formed on the first semiconductor layer, and a second semiconductor layer is formed on the light emitting structure layer. The second semiconductor layer and the first semiconductor layer possess opposite electrical characteristics. A first contact electrode and a second contact electrode are formed on the first semiconductor layer and the second semiconductor layer, respectively. A sub-mount is formed on the first and second contact electrodes, and the substrate is removed, so as to form the thin-film flip-chip LED having the roughened surface.

In an embodiment of the method for manufacturing the thin-film flip-chip LED, the method of roughening a surface of a first protrusion is carried out by performing an etching process.

In an embodiment of the method for manufacturing the thin-film flip-chip LED, the etching process is excimer laser etching, dry etching, or wet etching.

In an embodiment of the method for manufacturing the thin-film flip-chip LED, the first protrusion is a cone.

In an embodiment of the method for manufacturing the thin-film flip-chip LED, the cone is a circular cone, a triangular pyramid, or a quadrangular pyramid.

In an embodiment of the method for manufacturing the thin-film flip-chip LED, the substrate is selected from the group consisting of sapphire ($Al_2O_3$), silicon carbide (SiC), silicon (Si), gallium arsenide (GaAs), zinc oxide (ZnO), and a hexagonal crystal material.

In an embodiment of the method for manufacturing the thin-film flip-chip LED, the light emitting structure layer has a multi-quantum well (MWQ) structure. The MWQ structure includes a plurality of well layers and barrier layers, the well layers and the barrier layers are alternately stacked, and every two of the barrier layers have one well layer in between.

The invention further provides a thin-film flip-chip LED having a roughened surface formed by performing the manufacturing method described in the previous embodiments. The thin-film flip-chip LED at least includes a sub-mount, a first contact electrode, a second contact electrode, a second semiconductor layer, a light emitting structure layer, and a first semiconductor layer. The first contact electrode is arranged on the sub-mount, the second contact electrode is arranged on the sub-mount and located correspondingly to the first contact electrode, the second semiconductor layer is formed on the second contact electrode, the light emitting structure layer is formed on the second semiconductor layer, and the first semiconductor layer is correspondingly formed on the first contact electrode and the light emitting structure layer. Here, plural roughened patterned structures are formed on a surface of the first semiconductor layer away from the light emitting structure layer.

In an embodiment of the thin-film flip-chip LED, the patterned structures are circular cones, triangular pyramids, or quadrangular pyramids.

In an embodiment of the thin-film flip-chip LED, a gap exists between every two of the patterned structures.

As provided above, in the thin-film flip-chip LED having the roughened surface and the method for manufacturing the thin-film flip-chip LED, the etching process is performed to form the roughened surface with dual cones on the substrate, so as to ensure both the improved light output efficiency of the light beam emitted from the light emitting structure layer of the thin-film flip-chip LED and the simplicity of the process of manufacturing the thin-film flip-chip LED. In addition, the excimer laser process serves as the second roughening process performed on the patterned substrate, so as to resolve the issue of inconsistent dimensions of the structure resulting from wet etching and enhance the light emitting efficiency of the thin-film flip-chip LED. Finally, different from the conventional LED and the conventional manufacturing process of the LED, i.e., performing the roughening process after film deposition and manufacture of the components, in the thin-film flip-chip LED having the roughened surface and the method for manufacturing the thin-film flip-chip LED, the patterned substrate is firstly formed on the substrate, and the roughening process is performed on the patterned substrate, which may effectively prevent thin films and components from being damaged by the subsequent roughening process, protect the electrical behavior of the LED, and effectively enhance the light emitting efficiency of the LED.

DETAILED DESCRIPTION OF DISCLOSED EMBODIMENTS

Figure 1:
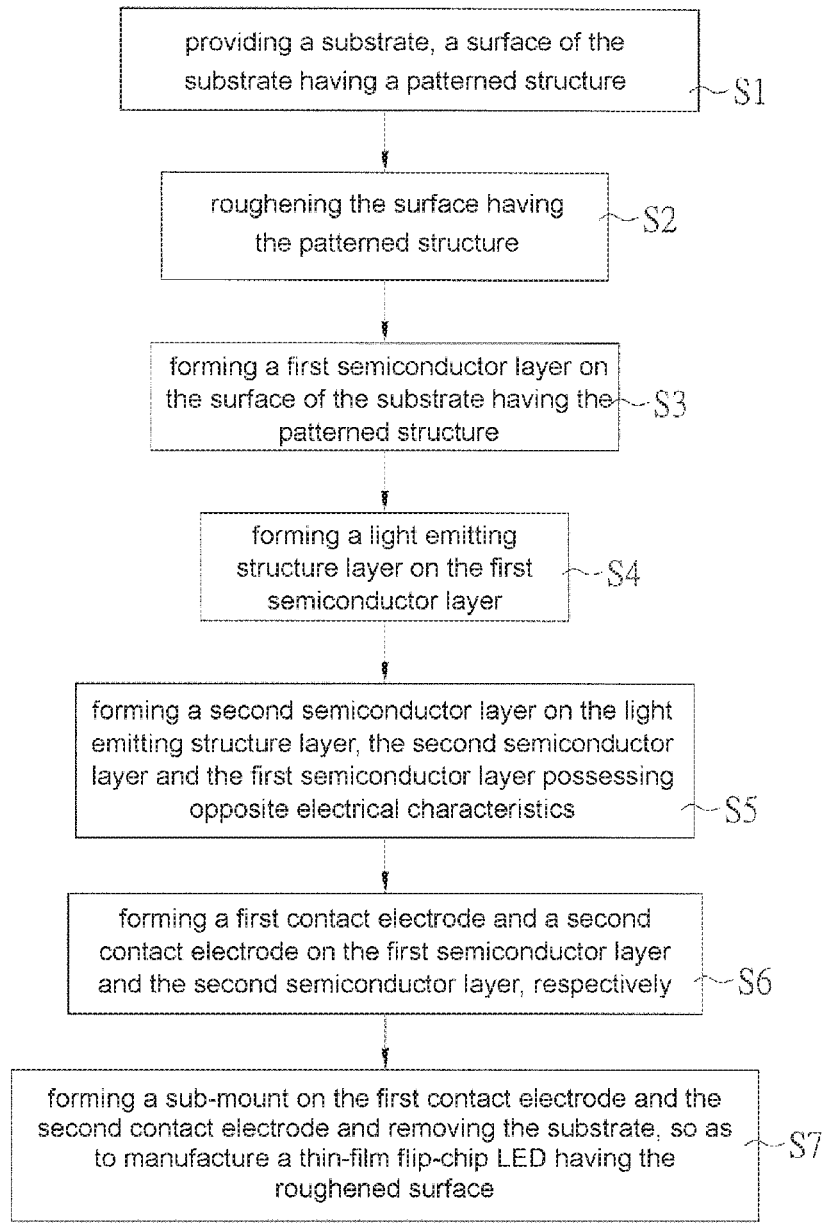
FIG. 1 is a flowchart illustrating steps of manufacturing a thin-film flip-chip LED with a roughened surface according to an embodiment of the invention.

The structural design and functions will be provided in the embodiments of the invention as illustrated in the drawings below for better understanding the invention.

First, in the following embodiments, it should be understood that the description of one layer (or film) or one structure arranged "on" or "below" another substrate, another layer (or film), or another structure may include the following: one layer (or film) or one structure is "directly" located on another substrate, another layer (or film), or another structure; one or more inter-layer is "indirectly" arranged between the layers (or films) or the structures. The location of each layer may be observed in the drawings.

Figure 2:
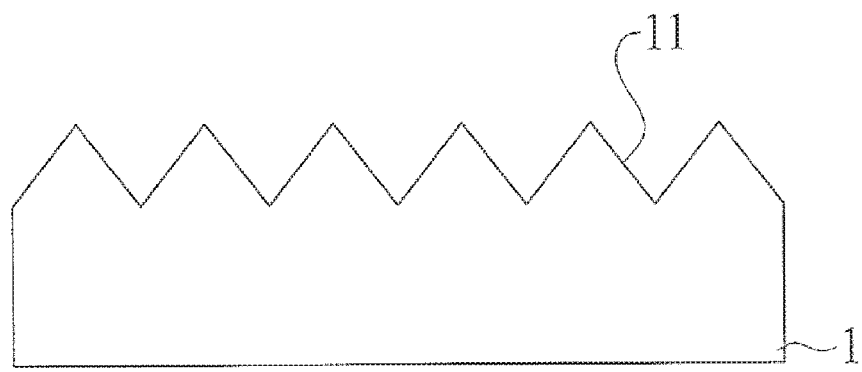
FIG. 2 is a schematic cross-sectional view illustrating a substrate with a patterned structure according to an embodiment of the method for manufacturing the thin-film flip-chip LED with the roughened surface.
Figure 3:
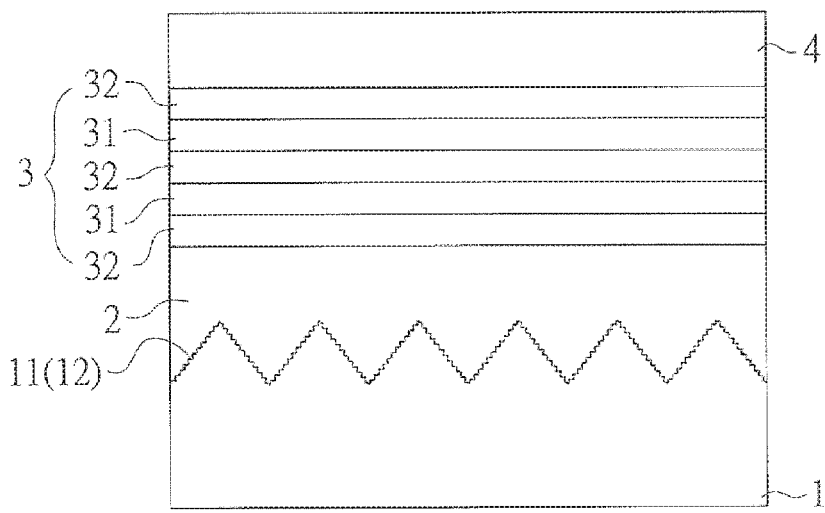
FIG. 3 is a schematic cross-sectional view illustrating stacked thin films according to an embodiment of the method for manufacturing the thin-film flip-chip LED with the roughened surface.

First, as shown in FIG. 1 to FIG. 3, which are respectively a flowchart illustrating steps of manufacturing a thin-film flip-chip LED with a roughened surface according to an embodiment of the invention, a schematic cross-sectional view illustrating a substrate with a patterned structure, and a schematic cross-sectional view illustrating stacked thin films, the method for manufacturing the thin-film flip-chip LED with the roughened surface provided herein includes following steps.

Step 1 (S1): providing a substrate (1), a surface of the substrate (1) having a patterned structure (11). The substrate (1) is selected front the group consisting of sapphire ($Al_2O_3$), silicon carbide (SiC), silicon (Si), gallium arsenide (GaAs), zinc oxide (ZnO), and a hexagonal crystal material; an embodiment of the invention, the substrate (1) is made of a $Al_2O_3$ material. The patterned structure (11) on the substrate (1) may be formed by performing a photolithography process and an etching process, so as to form a patterned substrate with consistent dimensions. The patterned structure (11) is a cone, and the cone may be a circular cone, a triangular pyramid, or a quadrangular pyramid.

Step 2: roughening the surface having the patterned structure (11). The step of roughening the surface having the patterned structure (11) is carried out by performing the etching step, and the etching step is excimer laser etching, dry etching, or wet etching. In embodiment of the invention, the excimer laser is applied to roughening the surface having the patterned structure (11). The excimer laser includes KrF excimer laser, KrCl excimer laser, ArF excimer laser, XeCl excimer laser, or XeF excimer laser. With use of one of the above-mentioned excimer lasers, the step of roughening the surface having the patterned structure (11) is carried out. However, note that the type of the excimer lasers provided above is merely exemplary and should not be construed as a limitation to the invention; people skilled in the pertinent art should know different types of excimer lasers applied to roughen the surface having the patterned structure (11) are not factors of affecting the implementation of the invention.

Step 3 (S3): forming a first semiconductor layer (2) on the surface of the substrate having the patterned structure (11). In an embodiment of the invention, the first semiconductor layer (2) is an n-type semiconductor layer and is coated onto the roughened surface of the substrate having the patterned structure (11) through metal-organic chemical vapor deposition (MOCVD).

Step 4 (S4): forming a light emitting structure layer (3) on the first semiconductor layer (2). In an embodiment of the invention, the light emitting structure layer (3) has an MWQ structure, and the MWQ structure includes a plurality of well layers (31) and barrier layers (32). The well layers (31) and the barrier layers (32) are alternately stacked, and every two of the barrier layers (32) have one of the well layers (31) in between. The light emitting structure layer (3) is also formed on the first semiconductor layer (2) through MOCVD.

Step 5 (S5): forming a second semiconductor layer (4) on the light emitting structure layer (3), wherein the second semiconductor layer (4) and the first semiconductor layer (2) possess opposite electrical characteristics. In an embodiment of the invention, the second semiconductor layer (4) is a p-type semiconductor layer which possesses electrical characteristics opposite to those of the first semiconductor layer (2) which is an n-type semiconductor layer, and the second semiconductor layer (4) is also formed on the light emitting structure layer (3) through MOCVD.

Figure 4:
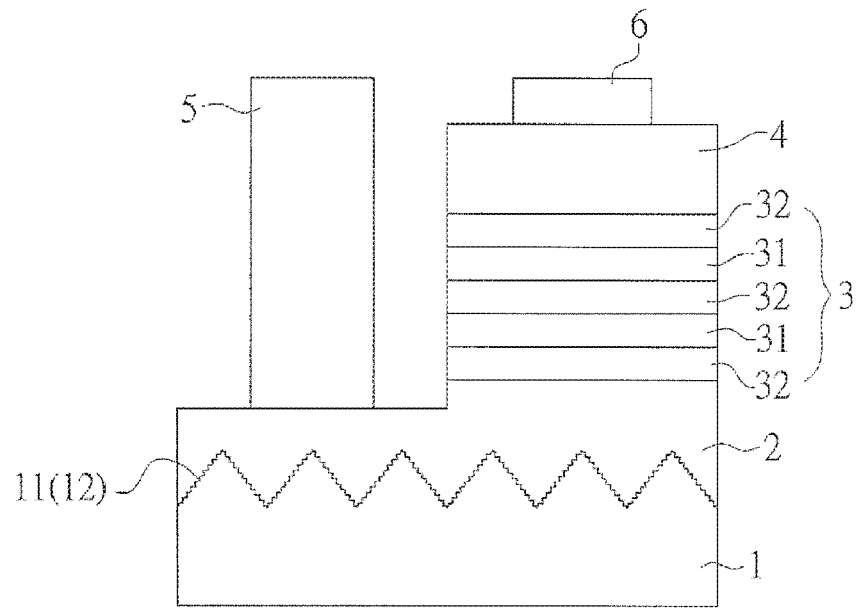
FIG. 4 is a schematic view of shaping electrodes according to an embodiment of the method for manufacturing the thin-film flip-chip LED with the roughened surface.

Step 6 (S6): forming a first contact electrode (5) and a second contact electrode (6) on the first semiconductor layer (2) and the second semiconductor layer (4), respectively. Please refer to FIG. 4 that is a schematic view of shaping electrodes according to an embodiment of the method for manufacturing the thin-film flip-chip LED with the roughened surface. Before the first contact electrode (5) and the second contact electrode (6) are formed and shaped, partial regions of the second semiconductor layer (4) and the light emitting structure layer (3) are removed by performing a photolithography process and an etching process, so as to expose the first semiconductor layer (2). The first contact electrode (5) and the second contact electrode (6) are then respectively formed on the first semiconductor layer (2) and the second semiconductor layer (4) in an ohmic-contact manner. In an embodiment of the invention, the first contact electrode (5) in contact with the first semiconductor layer (2) that is an n-type semiconductor layer is an n-type electrode, and the second contact electrode (6) in contact with the second semiconductor layer (4) that is a p-type semiconductor layer is a p-type electrode.

Step 7 (S7): forming a sub-mount (7) on the first contact electrode (5) and the second contact electrode (6) and removing the substrate (1), so as to manufacture the thin-film flip-chip LED having the roughened surface. Please refer to FIG. 5 that is a schematic view of shaping a sub-mount and removing a substrate according to an embodiment of the method for manufacturing the thin-film flip-chip LED with the roughened surface. Here, a laser lift-off (LLO) technique may be applied to remove the substrate (1) made of the $Al_2O_3$ material. Since the LLO technique is well known in the pertinent field, no further description is provided hereinafter. Additionally, a transparent sub-mount (7) is formed on the first contact electrode (5) and the second contact electrode (6) that have planes with the same altitude, which is one of the main technical features of the flip chip LED.

Figure 5:
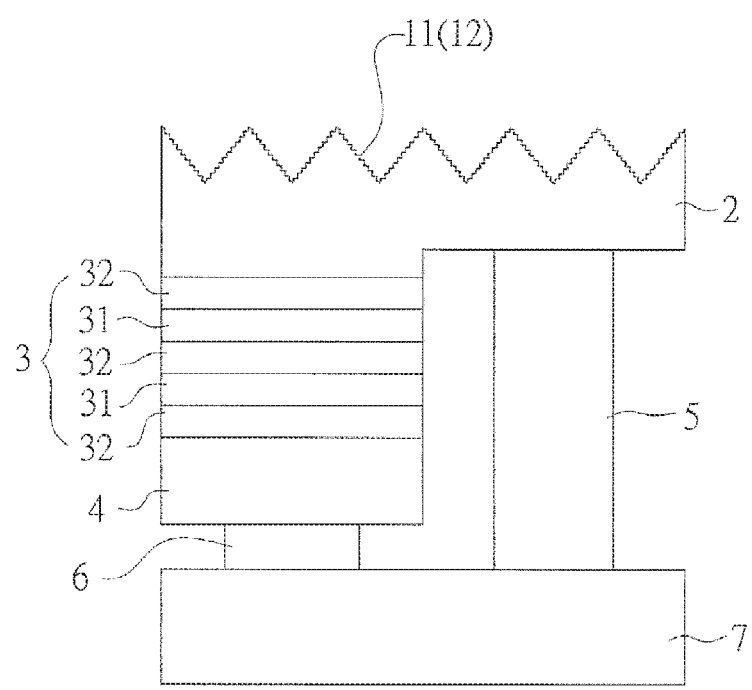
FIG. 5 is a schematic view of shaping a sub-mount and removing a substrate according to an embodiment of the method for manufacturing the thin-film flip-chip LED with the roughened surface.

The invention further provides a thin-film flip-chip LED with a roughened surface, and the thin-film flip-chip LED is formed by performing the above-mentioned manufacturing method. With reference to FIG. 5, the thin-film flip-chip LED with the roughened surface at least includes:

a sub-mount (7);

a first contact electrode (5) arranged on the sub-mount (7);

a second contact electrode (6) arranged on the sub-mount (7) and located corresponding to the first contact electrode (5);

a second semiconductor layer (4) formed on the second contact electrode (6), wherein in an embodiment of the invention, the second semiconductor layer (4) and the second contact electrode (6) are electrically connected in an ohmic-contact manner, and in an embodiment of the invention, the second semiconductor layer (4) is a p-type semiconductor layer, and the second contact electrode (6) is a p-type electrode;

a light emitting structure layer (3) formed on the second semiconductor layer (4), wherein the light emitting structure layer (3) has an MWQ structure, the MWQ structure includes a plurality of well layers (31) and barrier layers (32), the well layers (31) and the barrier layers (32) are alternately stacked, and every two of the barrier layers (32) have one of the well layers (31) in between;

a first semiconductor layer (2) correspondingly formed on the first contact electrode (5) and the light emitting structure layer (3), wherein plural roughened patterned structures are formed on a surface of the first semiconductor layer (2) away from the light emitting structure layer (3). In an embodiment of the invention, the first semiconductor layer (2) is an n-type semiconductor layer having the electrical characteristics opposite to those of the second semiconductor layer (4), and the first contact electrode (5) electrically connected to the first semiconductor layer (2) in an ohmic-contact manner is an n-type electrode. Besides, the roughened patterned structure is formed on the surface of the first semiconductor layer away from the light emitting structure layer (3) (i.e., the light output surface of the thin-film flip-chip LED having the roughened surface as provided herein) by performing dual-etching processes that may be excimer laser etching, dry etching, or wet etching. Thereby, the thin-film flip-chip LED having the roughened surface can have the improved light emitting efficiency.

Figure 6:
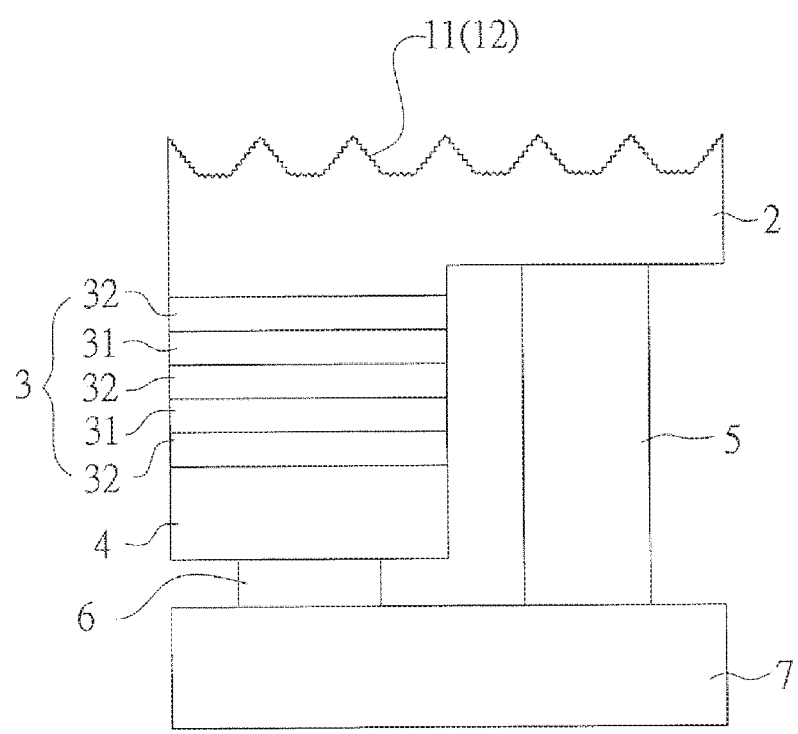
FIG. 6 is a schematic view illustrating gaps in a roughened structure according to another embodiment of the method for manufacturing the thin-film flip-chip LED with the roughened surface.

Besides, as shown in FIG. 6, which is a schematic view illustrating gaps in a roughened structure according to another embodiment of the method for manufacturing the thin-film flip-chip LED with the roughened surface, gaps with the same length exist between every two of the patterned structures (11) respectively having the roughened structure (12), which may also enhance the light emitting efficiency of the thin-film flip-chip LED having the roughened surface as provided herein.

In light of the foregoing embodiments, compared to the related art, the thin-film flip-chip LED having the roughened surface and the method for manufacturing the thin-film flip-chip LED have following advantages.

1. In the thin-film flip-chip LED having the roughened surface and the method for manufacturing the thin-film flip-chip LED, the etch process is performed to form the roughened surface shaped as dual cones on the substrate; thereby, the light beam emitted from the light emitting structure of the thin-film flip-chip LED may be characterized by the improved light emitting efficiency, and the method for manufacturing the thin-film flip-chip LED is characterized by its simplicity.

2. In the thin-film flip-chip LED having the roughened surface and the method for manufacturing the thin-film flip-chip LED, the second roughening process is performed on the patterned substrate by means of excimer laser, thereby rectifying the defects of inconsistent dimensions of the structure caused by wet etching and enhancing the light emitting efficiency of the thin-film flip-chip LED.

3. Different from the conventional LED and the conventional manufacturing process of the LED, i.e., performing the roughening process after film deposition and manufacture of the components, in the thin-film flip-chip LED having the roughened surface and the method for manufacturing the thin-film flip-chip LED, the patterned substrate is formed on the substrate, and the roughening process is then performed on the patterned substrate, which may effectively prevent thin films and components from being damaged by the subsequent roughening process, protect the electrical behavior of the LED, and effectively enhance the light emitting efficiency of the LED.

What is claimed is:

1. A method for manufacturing a light emitting diode, comprising:
providing a substrate having a patterned structure thereon;
etching the substrate;
forming an epitaxial structure comprising a first semiconductor layer formed on the patterned structure of the substrate, a light emitting structure layer formed on the first semiconductor layer and a second semiconductor layer formed on the light emitting structure layer, wherein the first semiconductor layer and the second semiconductor layer possess opposite electrical characteristics;
forming a sub-mount on the epitaxial structure;
removing the substrate from the epitaxial structure to expose a surface of the first semiconductor layer; and
etching the surface of the first semiconductor layer to form a roughened structure thereon.

2. The method for manufacturing the light emitting diode of claim 1, wherein the step for etching the substrate is performed by excimer laser etching, dry etching, or wet etching.

3. The method for manufacturing the light emitting diode of claim 1, wherein the step for removing the substrate from epitaxial structure is performed by laser lift-off process.

4. The method for manufacturing the light emitting diode of claim 1, wherein the step for etching the surface of the first semiconductor layer is performed by excimer laser etching, dry etching, or wet etching.

5. The method for manufacturing the light emitting diode of claim 1, wherein the substrate is selected from the group consisting of sapphire, silicon carbide, silicon, gallium arsenide, zinc oxide, and a hexagonal crystal material.

6. The method for manufacturing the light emitting diode of claim 1, wherein the light emitting structure layer has a multi-quantum well structure, the multi-quantum well structure comprises a plurality of well layers and barrier layers, the well layers and the barrier layers are alternately stacked, and every two of the barrier layers have one of the well layers in between.

7. A method for manufacturing a light emitting diode, comprising:
providing a sub-mount;
forming an epitaxial structure on the sub-mount, wherein the epitaxial structure comprising a first semiconductor layer, a light emitting structure layer formed on the first semiconductor layer and a second semiconductor layer formed on the light emitting structure layer, wherein the first semiconductor layer and the second semiconductor layer possess opposite electrical characteristics, wherein a surface of the first semiconductor layer away from the sub-mount is exposed; and
etching the surface of the first semiconductor layer to form a roughened structure thereon.

8. The method for manufacturing the light emitting diode of claim 7, wherein the step for etching the surface of the first semiconductor layer is performed by excimer laser etching, dry etching, or wet etching.

9. The method for manufacturing the light emitting diode of claim 7, wherein the light emitting structure layer has a multi-quantum well structure, the multi-quantum well structure comprises a plurality of well layers and barrier layers, the well layers and the barrier layers are alternately stacked, and every two of the barrier layers have one of the well layers in between.

10. A method for manufacturing a light emitting diode, comprising:
providing a substrate;
forming an epitaxial structure comprising a first semiconductor layer formed on the patterned structure of the substrate, a light emitting structure layer formed on the first semiconductor layer and a second semiconductor layer formed on the light emitting structure layer, wherein the first semiconductor layer and the second semiconductor layer possess opposite electrical characteristics;
mounting the epitaxial structure with the substrate to a sub-mount;
removing the substrate from the epitaxial structure to expose a surface of the first semiconductor layer; and
etching the surface of the first semiconductor layer to form a roughened structure thereon.

11. The method for manufacturing the light emitting diode of claim 10, wherein the step for removing the substrate from the epitaxial structure is performed by laser lift-off process.

12. The method for manufacturing the light emitting diode of claim 10, wherein the step for etching the surface of the first semiconductor layer is performed by excimer laser etching, dry etching, or wet etching.

13. The method for manufacturing the light emitting diode of claim 10, wherein the substrate is selected from the group consisting of sapphire, silicon carbide, silicon, gallium arsenide, zinc oxide, and a hexagonal crystal material.

14. The method for manufacturing the light emitting diode of claim 10, wherein the light emitting structure layer has a multi-quantum well structure, the multi-quantum well structure comprises a plurality of well layers and barrier layers, the well layers and the barrier layers are alternately stacked, and every two of the barrier layers have one of the well layers in between.

* * * * *